(12) United States Patent
Syzdek et al.

(10) Patent No.: US 7,564,716 B2
(45) Date of Patent: Jul. 21, 2009

(54) MEMORY DEVICE WITH RETAINED INDICATOR OF READ REFERENCE LEVEL

(75) Inventors: Ronald J. Syzdek, Austin, TX (US); David W. Chrudimsky, Austin, TX (US); Xiaojie He, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 44 days.

(21) Appl. No.: 11/560,554

(22) Filed: Nov. 16, 2006

(65) Prior Publication Data

US 2008/0117685 A1    May 22, 2008

(51) Int. Cl.
*G11C 11/34*    (2006.01)

(52) U.S. Cl. .............................. 365/185.2; 365/210.01; 365/210.14

(58) Field of Classification Search ............. 365/185.21
See application file for complete search history.

(56) References Cited

U.S. PATENT DOCUMENTS

| | | | |
|---|---|---|---|
| 5,386,388 A | 1/1995 | Atwood et al. | |
| 6,163,481 A | 12/2000 | Yamada et al. | |
| 6,678,192 B2 * | 1/2004 | Gongwer et al. | 365/185.2 |
| 6,735,114 B1 | 5/2004 | Hamilton et al. | |
| 6,906,951 B2 | 6/2005 | Wong | |
| 2005/0007834 A1 * | 1/2005 | Hidaka | 365/189.09 |
| 2007/0030729 A1 * | 2/2007 | Chan et al. | 365/185.2 |

OTHER PUBLICATIONS

Polansky et al., "A 4b/cell NROM 1Gb Data-Storage Memory," Saifun Semiconductors, Netanya, Isreal, Macroniz, Hsinchu, Taiwan, ISSCC 2006, 4 pages.

* cited by examiner

*Primary Examiner*—Hoai V Ho
*Assistant Examiner*—Anthan T Tran

(57) ABSTRACT

A read reference level of a plurality of read reference is determined for a set of bit cells of a non-volatile memory array. An indicator of the read reference level is stored in a non-volatile storage location associated with the set of bit cells. The indicator of the read reference level is accessed in response to a read access operation to the set of bit cells and a value stored at a memory location of the set of bit cells is sensed based on the indicator of the read reference level, whereby the memory location of the set of bit cells is associated with the read access operation.

21 Claims, 5 Drawing Sheets

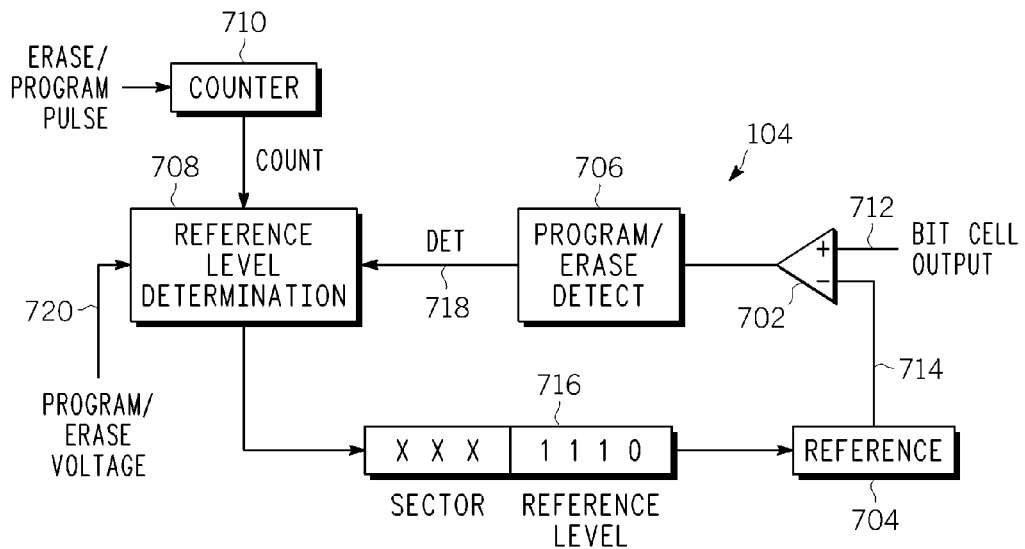
FIG. 7
FIG. 8
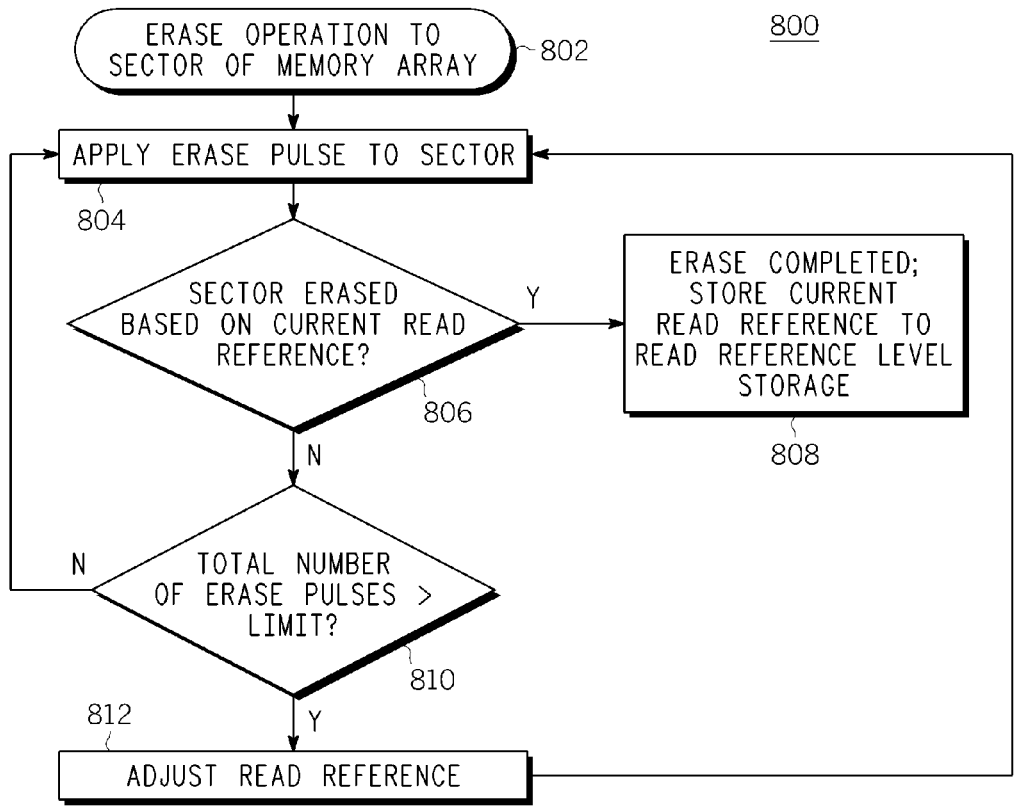

MEMORY DEVICE WITH RETAINED INDICATOR OF READ REFERENCE LEVEL

CROSS-REFERENCE TO RELATED APPLICATION

The present application is related to U.S. patent application Ser. No. 11/560,533 entitled "MEMORY DEVICE WITH ADJUSTABLE READ REFERENCE BASED ON ECC AND METHOD THEREOF" and filed on even date herewith, the entirety of which is incorporated by reference herein.

FIELD OF THE DISCLOSURE

The present disclosure relates generally to memory devices and more particularly to read accesses to non-volatile memory devices.

BACKGROUND

Non-volatile memory (NVM) devices typically are composed of an array of bit cells, with each bit cell storing a corresponding bit of data. Each bit cell generally is configured as one or more transistors capable of storing electrons as charge, and thereby affecting the relationship between the control electrode voltage and the drain current of the transistor. The transistor is "erased" to one state (e.g., a logic "1") by clearing the charge and the transistor is "programmed" to another state (e.g., a logic "0") by storing charge at the transistor. Thus, the bit value "stored" by the transistor can be sensed by comparing a reference (either a current or a voltage) with the drain current of the transistor in response to the application of a read voltage to the control electrode of the transistor, whereby the "stored" value is determined to be one state (e.g., a logic "1" or an "erased" state) if the drain current is greater than the read reference and determined to be another state (e.g., a logic "0" or a "programmed" state) if the drain current is less than the read reference.

Some NVM architectures utilize an insulating element, such as a thin film nitride layer, at the transistor. These architectures typically offer reduced production costs compared to other types architectures due to reduced silicon area, fewer processing steps and generally higher yields. However, for many thin film architectures and similar architectures, the insulating element exhibits a "trap-up" characteristic over numerous program/erase cycles whereby the insulating element becomes saturated with charge, thereby increasing the threshold voltage ($V_t$) of the bit cell and consequently decreasing the drain current of the bit cell in response to the same control electrode voltage. Accordingly, if a fixed read reference is used, increasing trap-up of the bit cell eventually will cause an erroneous read of the bit cell due to the decreasing drain current in comparison to the fixed read reference.

Conventional read reference adjustment techniques have been developed to attempt to overcome the trap-up characteristics of NVM bit cells. One conventional technique includes the use of a reference transistor that is used to generate the read reference based on the assumption that the reference transistor will exhibit the same or similar trap up characteristics as the bit cell. This approach typically entails subjecting the reference transistor to the same program/erase cycles in accordance with the array cells it is attempting to emulate. Another conventional technique uses a fixed reference current. In this approach, design considerations must be made to account for end-of-life characteristics that force a larger operating window at beginning-of-life, increase power consumption, as well as force less-optimum design choices. Another characteristic common to conventional read reference adjustment techniques is that the read reference must be recalibrated at initial startup of the memory device or in response to a reset event at the memory device, resulting in a delayed initialization of the memory device. Accordingly, an improved technique for adjusting the read reference for a NVM device would be advantageous.

BRIEF DESCRIPTION OF THE DRAWINGS

The present disclosure may be better understood, and its numerous features and advantages made apparent to those skilled in the art by referencing the accompanying drawings.

FIG. 7 is a diagram illustrating an implementation of a reference configuration module of the NVM device of FIG. 1 in accordance with at least one embodiment of the present disclosure.

FIG. 8 is a flow diagram illustrating a method for determining a read reference level for a sector of a NVM device during an erase operation in accordance with at least one embodiment of the preset disclosure.

The use of the same reference symbols in different drawings indicates similar or identical items.

DETAILED DESCRIPTION

Figure 1:
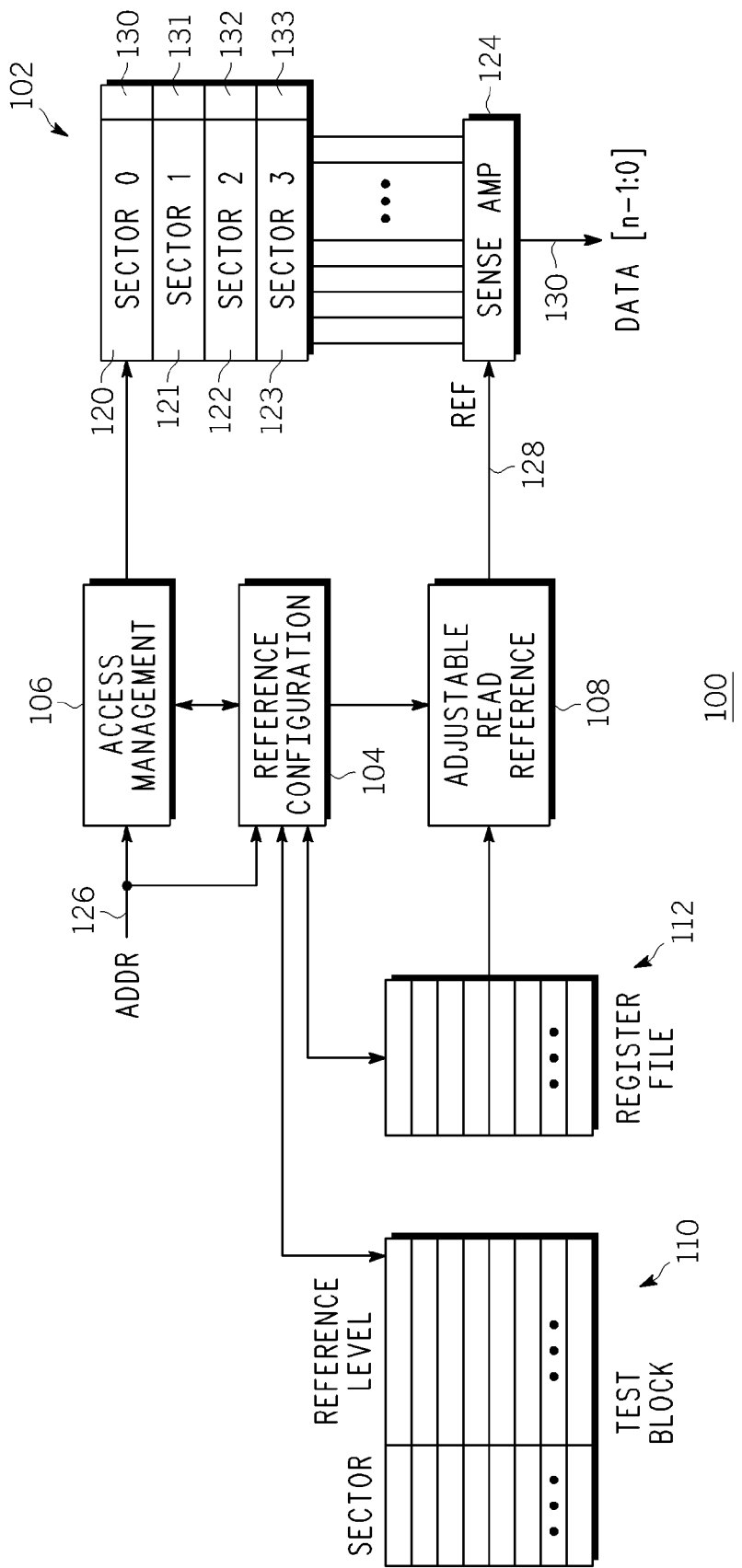
FIG. 1 is a block diagram illustrating a non-volatile memory (NVM) device having non-volatile storage for storing indicators of a read reference level for a corresponding sector of the NVM device in accordance with at least one embodiment of the present disclosure.

In accordance with one aspect of the present disclosure, a method includes determining, for a set of bit cells of a non-volatile memory array, a read reference level of a plurality of read reference levels and storing an indicator of the read reference level in a non-volatile storage location associated with the set of bit cells. In one embodiment, the method further includes accessing the indicator of the read reference level in response to a read access operation to the set of bit cells and sensing a value stored at a memory location of the set of bit cells based on the indicator of the read reference level, the memory location of the set of bit cells associated with the read access operation.

In accordance with another aspect of the present disclosure, a method includes receiving a read access request to a memory location of a set of bit cells of a plurality of sets of bit cells of a non-volatile memory array. The method further includes accessing a indicator of a read reference level from a non-volatile storage location in response to receiving the read access request and sensing a value stored at the memory location based on the indicator.

In accordance with yet another aspect of the present disclosure, a device includes non-volatile memory array including a plurality of sets of bit cells and a plurality of non-volatile storage locations, each non-volatile storage location associated with a corresponding set of bit cells of the plurality of sets of bit cells. The device further includes a reference configuration module configured to determine a read reference level for each of the plurality of sets of bit cells and store an indicator of the read reference level in a corresponding non-volatile storage location of the plurality of non-volatile storage locations.

FIGS. 1-8 illustrate techniques for determining an appropriate read reference level for each of at least a subset of the sectors of a non-volatile memory (NVM) device and then storing indicators of the determined read reference levels in non-volatile storage so that the determined read references levels are retained subsequent to a deactivation or reset of the NVM device. In one embodiment, the read reference level for a sector is determined in response to a program operation or an erase operation jointly referred to herein in the alternate as "program/erase operation") and an indicator of the determined read reference level is stored in non-volatile storage. Subsequently, the NVM device can access the non-volatile storage to obtain the indicator of the read reference level for a particular sector corresponding to a memory location and then configure a sense amplifier to utilize a read reference represented by the indicator for the purpose of sensing the value stored in the memory location in response to a memory access request to the memory location.

The term "read reference," as used herein, refers to either a read reference voltage or a read reference current, depending on implementation. The term "sector," as used herein, refers to an individually programmable/erasable unit of a memory array. The term "memory location," as used herein, refers to an individually addressable set of bit cells of a memory array. A sector includes one or more memory locations. The term "set of bit cells," as used herein, refers to one or more bit cells.

FIG. 1 illustrates a non-volatile memory (NVM) device 100 in accordance with at least one embodiment of the present disclosure. The NVM device 100 can be implemented as one or more separate integrated circuits (ICs), such as in an application specific integrated circuit (ASIC), or other stand-alone memory device. Alternately, the NVM device 100 can be implemented in another device, such as, for example, a microprocessor or microcontroller implemented as a system-on-a-chip (SOC). In the depicted example, the NVM device 100 includes a NVM array 102, a reference configuration module 104, an access management module 106, an adjustable read reference generator 108, a read reference level storage 110, and a register file 112. The reference configuration module 104 can be configured as, for example, a state machine or other hardware-based component (e.g., a digital logic component). The NVM array 102 includes a bit cell matrix comprising a plurality of bit cells organized as a plurality of sectors (e.g., sectors 120, 121, 122, and 123, hereinafter "sectors 120-123"), and a sense amplifier module 124. The NVM array 102 can include any of a variety of non-volatile memory cell architectures, such as, for example, thin-film storage (TFS) architectures, high K dielectric or nanocrystal architectures, nitride-based architectures, resistive memory architectures, magnetic random access memory (MRAM) architectures, and the like. The read reference level storage 110, in one embodiment, includes non-volatile storage, such as a test block for the NVM array 102 or a set of memory locations 130, 131, 132, and 133 of the NVM array 102.

The NVM array 102 is configured to access a memory location of one of the sectors 120-123 based on a supplied address (ADDR signal 126). In at least one embodiment, each memory location includes a data field to store a data value. The sense amplifier module 124 is configured to sense the bit values stored in the set of bit cells at the accessed memory location based on a supplied read reference (read reference 128) and provide the sensed bit values at the memory location as a data value 130.

The adjustable read reference generator 108 is configured to provide the read reference 128, whereby the adjustable read reference generator 108 can adjust the level (i.e., the voltage or current) of the read reference 128 based on control input from the reference configuration module 104 or based on the indicator of the read reference level for the sector as stored in the register file 112 or the read reference level storage 110. The adjustable read reference generator 108 can be implemented as, for example, a current mirror having an output configured to provide the read reference 128 and an input connected to a plurality of current sources in parallel, whereby the current sources are individually activated or deactivated in accordance with the desired aggregate current output. To illustrate, the adjustable read reference generator 108 can include five 2 microamp (uA) current sources individually activated or deactivated to provide an aggregate current between 0 uA and 10 uA and thus the read reference for each sector can be set at one of 0 uA, 2 uA, 4 uA, 6 uA, 8 uA, or 10 uA. Other configurations of the adjustable read reference generator 108 may be utilized as appropriate without departing from the scope of the present disclosure.

In one embodiment, the particular bit sequence sensed by the sense amplifier module 124 for a particular memory location of the NVM array 102 is based on the relationship between the drain currents of the bit cells at the memory location and the level for the read reference 128 used by the sense amplifier module 124 as one or more of the bit cells may be sensed as having different bit values for different levels of the read reference 128. Further, as noted above, the transistors representing the bit cells of a sector of the NVM array 102 may exhibit a trap-up characteristic whereby the threshold voltage $V_t$ increases over the life of the NVM array 102, thereby decreasing the drain current provided by transistors when accessed. Accordingly, in response to certain memory events, such as a program/erase operation for one of the sectors, the reference configuration module 104 determines an appropriate read reference level for subsequent read accesses to the sector using any of a variety of techniques and then stores an indicator of the determined read reference level in the read reference level storage 110 so that the indicator of the determined read reference level can be retained in the event of a power-down or reset of the NVM device 100. Accordingly, in response to a reset event, such as a "soft" reset or a power-down/power-up cycle of the NVM device 100, the reference configuration module 104 loads the read reference indicators from the read reference level storage 110 to a temporary volatile memory (e.g., the register file 112) for rapid access. Subsequently, in response to a read access to one of the sectors 120-123, the reference configuration module 104 accesses the read reference indicator for the sector from the read reference level storage 110 (or alternately, from the register file 112) and configures the adjustable reference generator 108 to output a level for the read reference 128 that is substantially equivalent to the read reference level indicated by the accessed read reference indicator.

Figure 2:
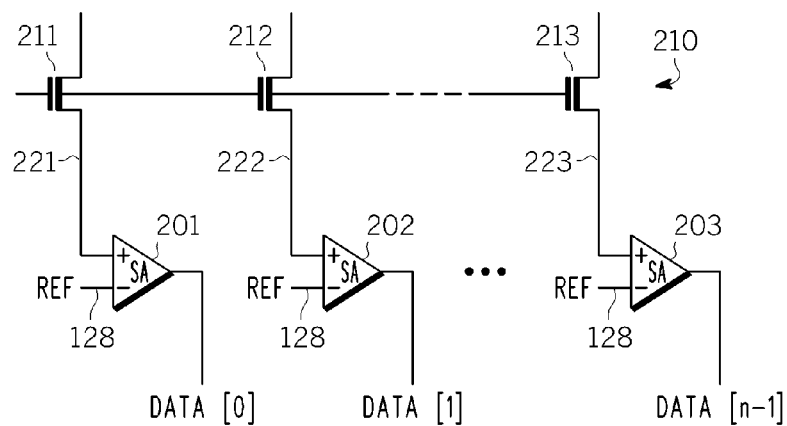
FIG. 2 is a circuit diagram illustrating an implementation of a sense amplifier module of FIG. 1 in accordance with at least one embodiment of the present disclosure.

FIG. 2 illustrates an implementation of the sense amplifier module 124 of FIG. 1 in accordance with at least one embodiment of the present disclosure. In the depicted example, the sense amplifier module 124 includes a plurality of sense amplifiers, including sense amplifiers 201, 202, and 203 (hereinafter, "sense amplifiers 201-203"). Each sense amplifier includes an input to receive the read reference 128 and an input coupleable to a bit cell of a memory location 210 of a sector of the NVM array 102 (FIG. 1) via a corresponding bit line of a plurality of bit lines (including bit lines 221, 222, and 223). The memory location 210 includes a set of bit cells, including bit cells 211, 212, and 213, wherein each bit cell is used to store a corresponding bit of stored data.

During an access to the memory location 210, a read voltage is applied to the control electrode of each of the plurality of bit cells of the memory location 210 and each of the sense amplifiers compares the resulting drain current of the corresponding bit cell with the read reference 128. In the event that the drain current of the bit cell is greater than the read reference 128, the output of the sense amplifier therefore is asserted as a logic "1" so as to indicate the sensing of a logic "1" stored at the corresponding bit cell. Conversely, in the event that the drain current of the bit cell is not greater than the read reference 128 the output of the sense amplifier therefore is asserted as a logic "0" so as to indicate the sensing of a logic "0" stored at the corresponding bit cell. The sensed value for each of the bits of the data[0:n−1] value is based on the relationship between the drain current of the corresponding bit cell and the read reference 128.

Figure 3:
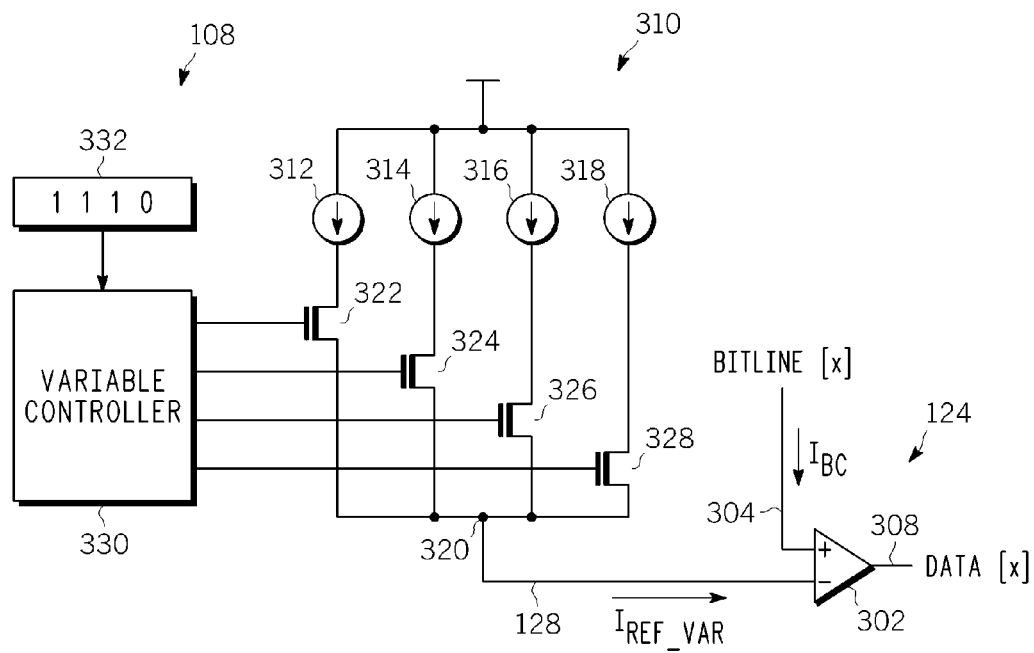
FIG. 3 is a circuit diagram illustrating an adjustable read reference configuration in accordance with at least one embodiment of the present disclosure.
Figure 4:
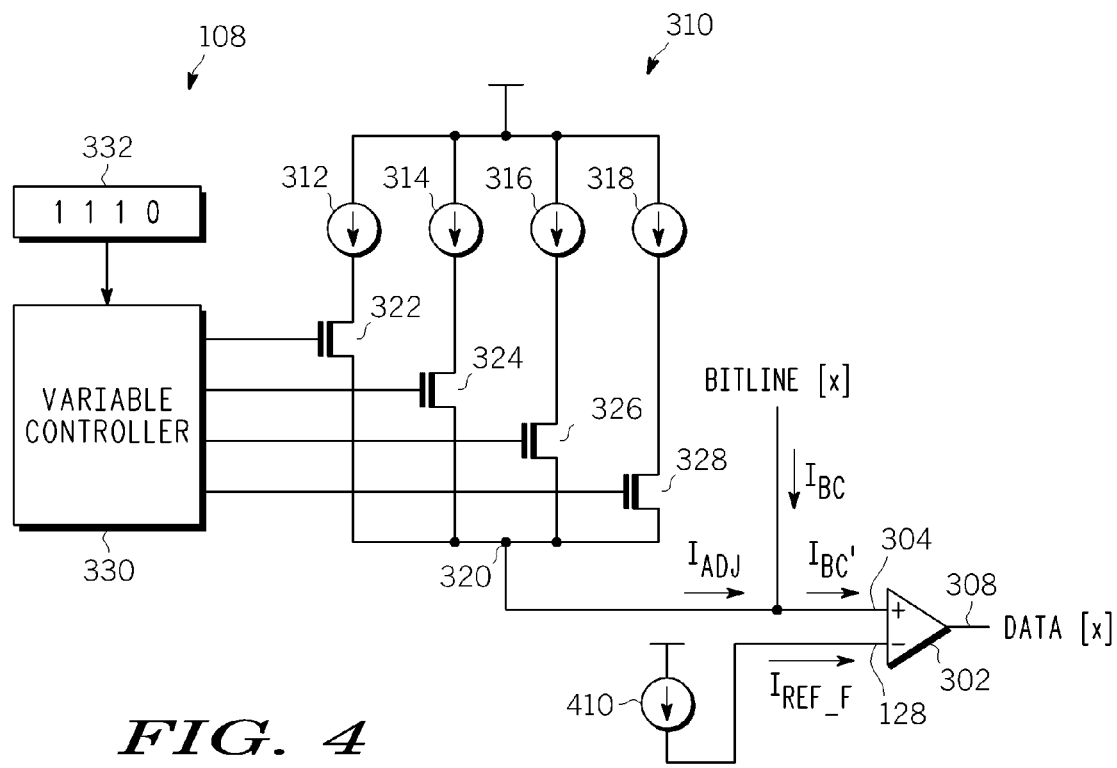
FIG. 4 is a circuit diagram illustrating another adjustable read reference configuration in accordance with at least one embodiment of the present disclosure.

FIGS. 3 and 4 illustrate various implementations of the adjustable read reference generator 108 and the sense amplifier module 124 of FIG. 1 with respect to a bit line in accordance with at least one embodiment of the present disclosure. As depicted by both FIG. 3 and FIG. 4, the sense amplifier module 124 can include a sense amplifier 302 associated with a particular bit line (bit line[x]), whereby the sense amplifier 302 includes a first input configured to receive a bit cell current 304 (current $I_{BC}$) based on the current output by a bit cell being sensed via the bit line[x], a second input configured to receive a current representative of the read reference 128, and an output to provide a signal 308 representative of the value of bit x of a data value (data[x]) based on the relationship between the bit cell current 304 and the current representative of the read reference 128.

In the example of FIG. 3, the adjustable read reference generator 108 supplies an adjustable current (current $I_{REF\_VAR}$) as the read reference 128. The adjustable read reference generator 108 includes a variable current source 310 and a variable controller 330. The variable current source 310 includes a plurality of current sources, such as current sources 312, 314, 316, and 318, each current source connected to a common node 320 via a corresponding transistor, such as transistors 322, 324, 326, and 328. The common node 320 in turn is connected to the second input of the sense amplifier 302, such as via a current mirror (not shown). The variable controller 330 includes an input configured to receive or access a read reference indicator 332 from a corresponding location of the read reference level storage 110 (FIG. 1). Based on the read reference indicator 332, the variable controller 330 is configured to enable or disable the transistors 322, 324, 326, and 328 such that aggregate current supplied to the common node 320 is substantially equivalent to the read reference level represented by the read reference indicator 332.

In the example of FIG. 4, a current source 410 supplies a fixed current ($I_{REF\_F}$) as the read reference 128 and the adjustable read reference generator 108 supplies an adjustable current $I_{ADJ}$. The common node 320 is coupled to the first input of the sense amplifier 302 such that the sense amplifier 302 provides the signal 308 representative of the value of data[x] based on the relationship between the fixed current ($I_{REF\_F}$) and a current $I_{BC'}$ that is the aggregate of the adjustable current $I_{ADJ}$ and the bit cell current $I_{BC}$. In this instance, the read reference indicator 332, rather than representing the current level to be supplied as the read reference 128, instead represents the current level to be used to augment the bit cell current $I_{BC}$ relative to the fixed read current $I_{REF\_F}$ representative of the read reference 128.

As will be appreciated, the bit value output by the sense amplifier 302 is based on the relationship between the current received at the first input of the sense amplifier 302 and the current received at the second input of the sense amplifier 302. In the example of FIG. 3, this relationship can be adjusted by adjusting the current received at the second input of the sense amplifier 302, and in the example of FIG. 4, this relationship can be adjusted by adjusting the current received at the first input of the sense amplifier 302 by bolstering the bit cell current $I_{BC}$ with an adjustable current. Alternatively, the adjustable current can be subtracted from a fixed read reference current. Thus, assuming the adjustable read reference generator 108 provides the same output current at the common node 320 in both the implementation of FIG. 3 and FIG. 4, in both implementations the relationship between the current at the first input and the current at the second input of sense amplifier 302 is the same. That is, an increase in the adjustable reference current $I_{REF\_VAR}$ by 2 uA in the implementation of FIG. 3 would have the same effect as the supplementation of the bit cell current $I_{BC}$ by 2 uA (as the adjustable current $I_{ADJ}$) in the implementation of FIG. 4. Thus, the read reference for a given sector as described herein can refer to ether the read reference current supplied to one input of a sense amplifier as in FIG. 3, or to the read reference current supplied to one input of the sense amplifier in addition to the bolster current combined with the bit cell current at the other input of the sense amplifier as in FIG. 4.

Figure 5:
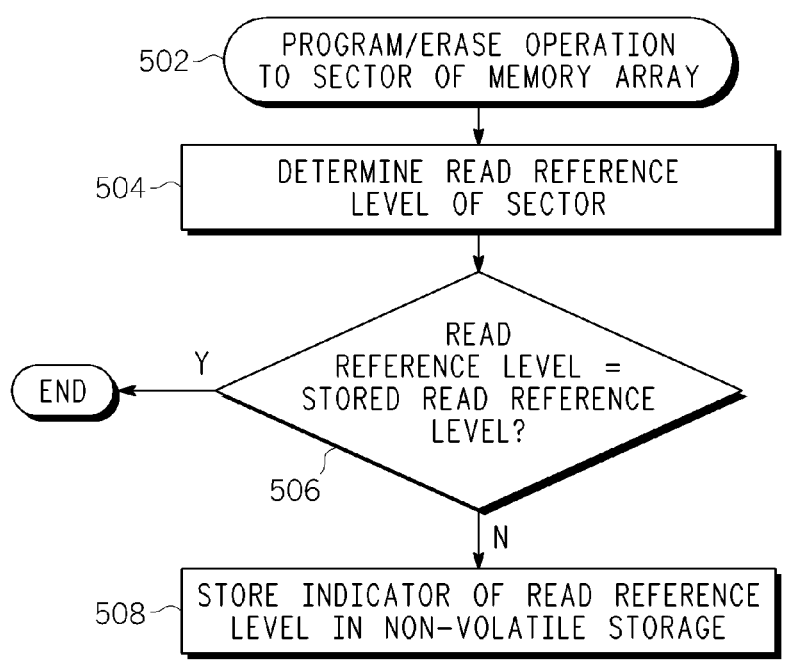
FIG. 5 is a flow diagram illustrating a method for determining a read reference level for a sector of a NVM device and storing an indicator of the read reference level in non-volatile storage in accordance with at least one embodiment of the present disclosure.

FIG. 5 illustrates a flow diagram 500 for determining the read reference for a sector of a NVM array in accordance with at least one embodiment of the present disclosure. For ease of illustration, the flow diagram 500 is described in the example context of the NVM device 100 of FIG. 1.

In one embodiment, the flow diagram 500 initiates in response to a program operation or an erase operation to the sector (as represented by block 502). At block 504, the reference configuration module 104 determines an appropriate read reference level for the sector. Exemplary techniques for determining the appropriate read reference level are described herein with reference to FIGS. 7 and 8.

At block 506, the reference configuration module 104 determines whether a previously-stored read reference indicator at the read reference level storage 110 references the same read reference level determined at block 504. If so, the flow diagram 500 ends. Otherwise, at block 508, the reference configuration module 104 stores an indicator of the read reference for the sector determined at block 504 in a corresponding storage location of the read reference level storage 110. In one embodiment, the read reference level storage 110 comprises non-volatile memory such that the read references for the sectors of the NVM array 102 can be retained when the NVM device 100 is powered down. It will be appreciated that due to the trap-up characteristics of the bit cells of the NVM array 102, the read reference for a sector is likely to decrease, rather than increase, over time. Accordingly, in one embodiment, the stored read reference indicator may be formatted such that the adjustment of the read reference for a sector from one level to another level requires programming only a single bit of the stored indicator.

Figure 6:
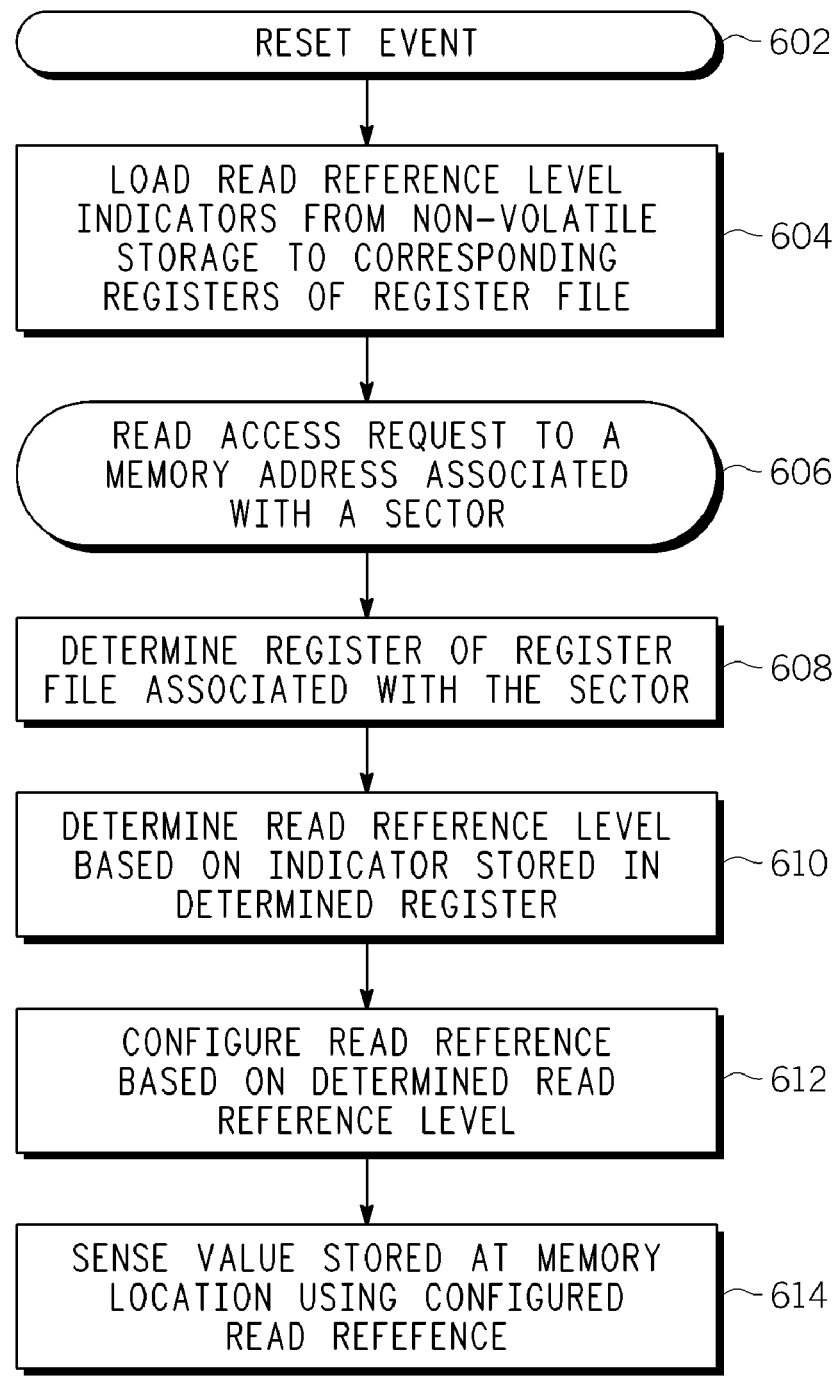
FIG. 6 is a flow diagram illustrating a method for accessing a stored indicator of a read reference level and sensing a value stored at a memory location based on a read reference represented by the stored indicator in accordance with at least one embodiment of the present disclosure.

FIG. 6 illustrates a flow diagram 600 representing an operation of an NVM device in response to a reset event or a power-up event in accordance with at least one embodiment of the present disclosure. For ease of illustration, the flow diagram 600 is described in the example context of the NVM device 100 of FIG. 1.

At block 602, a reset event occurs for the NVM device 100. In response to the reset event, the reference configuration module 104 loads the indicators of the read reference levels (also referred to herein as "the read reference indicators") for the sectors of the NVM array 102 from the read reference level storage 110 to a temporary storage location, such as corresponding registers of the register file 112.

At block 606, the NVM device 100 receives a read access request to a memory address associated with a particular sector of the NVM array 102. In response to the read access request, at block 608 the reference configuration module 104 identifies the register of the register file 112 that corresponds to the particular sector, and at block 610 the reference configuration module 104 determines the read reference level for the sector based on the read reference indicator stored in the identified register of the register file 112. At block 612, the reference configuration module 104 configures the adjustable read reference generator 108 to provide a level for the read reference 128 that is substantially equivalent to the read reference level indicated by the read reference indicator. As discussed with respect to FIG. 3, the adjustable read reference generator 108 can provide an adjustable current as the read reference 128, or as discussed with respect to FIG. 4, the adjustable read reference generator 108 can provide a fixed current as the read reference 128 and bolster the bit cell output current with an adjustable reference current based on the read reference indicator. At block 614, the sense amplifier module 124 senses the value stored at the memory location based on the bit cells' output currents and the output of the adjustable read reference generator 108. The sensed value then can be provided to the device that supplied the read access request.

FIG. 7 illustrates an implementation of the reference configuration module 104 of FIG. 1 in accordance with at least one embodiment of the present disclosure. In the depicted example, the reference configuration module 104 includes a sense amplifier 702, an adjustable reference generator 704, a program/erase detect module 706, a reference level determination module 708, and a counter 710.

The sense amplifier 702 includes a first input connectable to a select bit cell of the NVM array 102 (FIG. 1) to receive the bit cell output current 712 during an access to the select bit cell. The sense amplifier 702 further includes a second input to receive a reference 714, and an output to provide either a first value or a second value based on the relationship between the bit cell output current 712 and the reference 714. The sense amplifier 702 can include a sense amplifier from the sense amplifier module 124 (FIG. 1) or a separate sense amplifier. The adjustable reference generator 704 includes an input configured to receive a read reference indicator from a register 716 used to store the read reference indicator and a sector identifier. The adjustable reference generator 704 further includes an output configured to provide the reference 714 at a level indicated by the read reference indicator from the register 716. The adjustable reference generator 704 can be implemented as the adjustable read reference generator 108 (FIG. 1) or a separate reference generator. The counter 710 includes an input to receive an indicator that an erase pulse or a program pulse is being applied and an output to provide a total or cumulative number of erase/program pulses during an erase/program operation.

The program/erase detect module 706 includes an input coupled to the output of the sense amplifier 702 and an output configured to assert a detect signal 718 in response to detecting that the bit cell being sensed by the sense amplifier has either been sufficiently programmed or sufficiently erased, depending on the mode, based on the output of the sense amplifier 702. The reference level determination module 708 includes an input to receive the detect signal 718, an input to receive the count value of the counter 710, and an input to receive a signal 720 indicating a program voltage or an erase voltage (referred to as program/erase voltage) being applied to the bit cell being sensed, and an output configured to provide a determined read reference indicator for storage in the register 716. Various example modes of operation of the reference level configuration module 108 are described herein with reference to FIG. 8.

FIG. 8 illustrates a flow chart 800 depicting a mode of operation of the reference level configuration module 108 (FIG. 7) for determining an appropriate read reference level for a sector of a NVM array during an erase operation in accordance with at least one embodiment of the present disclosure. Although the flow chart 800 illustrates a technique in the context of an erase operation, it will be appreciated that the technique also may be applied in the context of a program operation, as appropriate. For ease of discussion, the flow diagram 800 is described in the context of FIGS. 1 and 7.

At block 802, an erase operation to a sector of the NVM array is initiated. During initialization, the adjustable reference generator 704 is configured to provide a read reference level for the reference 714 indicated by a read reference indicator for the sector that is stored in the read reference level storage 110, if available. If a read reference level for the sector has not been previously determined and stored, the read reference is set to an initial value.

At block 804, an erase pulse (or a sequence of erase pulses) is applied to the bit cells of the sector (e.g., by applying erase voltage pulses to the control gate of each of the bit cells in the sector) in an effort to erase each of the bit cells of the sector. Other erasing techniques may be used in other embodiments instead of, or in addition to, an erase pulse.

At block 806, the reference configuration module 108 determines whether all of the bit cells of the sector have been successfully erased based on the current read reference level of the reference 714. To illustrate in the context of the implementation of FIG. 7, as each bit cell is being erased, the adjustable reference generator 704 provides a level for the reference 714 equivalent to the determined read reference and the sense amplifier 702 compares the bit cell output current 712 to the reference 714. If the comparison indicates that the bit cell output current 712 is greater than the reference 714 (which, in this example, indicates that the bit cell being sensed has an "erased" state"), the sense amplifier 702 provides a first value at its output, in response to which the program/erase detect module 706 asserts the detect signal 718. If the comparison indicates that the bit cell output current 712 is less than the reference 714 (which, in this example, indicates that the bit cell being sensed has a "programmed" state), the sense amplifier 702 provides a second value at its output, in response to which the program/erase detect module 706 deasserts the detect signal 718. This process is then repeated for each bit cell of the sector.

In the event that all of the bit cells of the sector are sensed as sufficiently erased based on the current read reference, at block 808 the reference configuration module 108 determines stores an indicator of the current read reference level at a location of the read reference level storage 110 corresponding to the sector being erased, as well as in the corresponding register of the register file 112.

In the event that at least one bit cell of the sector (or, alternately, at least one bit cell of the sample set) is not sufficiently erased based on the applied erase pulse or pulses, at block 810 the program/erase detect module 706 determines whether the total number of erase pulses applied to the bit cells of the sector being erased has exceeded a limit. If the limit has not been exceeded, flow returns to block 804, whereby additional erase pulses are applied to the bit cells of the sector. The limit on erase pulses applied at each iteration of the process block 804 can be fixed, or can vary. To illustrate, for each successive iteration, the limit can be decreased. The processes of blocks 806, 808, and 810 then can be repeated in response to the application of the additional erase pulses.

In the event that the total number of erase pulses has met or exceeded the limit, at block 812 the adjustable reference generator 704 is configured to adjust (e.g., decrease) the read reference level of the reference 714 and the process represented by blocks 804-810 can be repeated using the adjusted read reference level as the current read reference. Further, in one embodiment, after a certain number of iterations, the limit on the total number of erase pulses is set to zero, thereby resulting in the iterative adjustment of the read reference level until the sector is identified as sufficiently erased without the application of additional erase pulses. Thus, the process of adjusting the read reference level and applying the erase pulses can be repeated until all of the bit cells (or all of the sampled set) are identified as erased using the adjusted read reference level, at which point the erase operation is identified as completed and an indicator of the adjusted read reference level is stored in the read reference level storage 110 at block 808.

Although FIG. 8 illustrates an example technique for determining the appropriate read reference level for a sector, any of a variety of techniques may be utilized without departing from the scope of the present disclosure. To illustrate, many NVM devices utilize error correcting code (ECC) operations to detect an/or correct errors in stored values. It will be appreciated the change in value at one or more bit positions of a bit sequence provided to an ECC decoder typically will result in a change in the error code condition indicated by the ECC decoder for the memory location. Accordingly, in one embodiment, the change in the error code condition between successive read accesses to the same memory location using different levels for the read reference 128 can be used to detect the appropriate read reference level for the sector.

The preceding description is intended to convey a thorough understanding of the present disclosure by providing a number of specific embodiments and details involving adjusting the read reference for a non-volatile memory. It is understood, however, that the present disclosure is not limited to these specific embodiments and details, which are exemplary only, and the scope of the disclosure is accordingly intended to be limited only by the following claims and equivalents thereof. It is further understood that one possessing ordinary skill in the art, in light of known systems and methods, would appreciate the use of the present disclosure for its intended purposes and benefits in any number of alternative embodiments, depending upon specific design and other needs.

In this document, relational terms such as "first" and "second", and the like, may be used solely to distinguish one entity or action from another entity or action without necessarily requiring or implying any actual such relationship or order between such entities or actions. The terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

The term "another", as used herein, is defined as at least a second or more. The terms "including", "having", or any variation thereof, as used herein, are defined as comprising. The term "coupled", as used herein with reference to electro-optical technology, is defined as connected, although not necessarily directly, and not necessarily mechanically.

What is claimed is:

1. A method comprising:

determining, for a first set of bit cells of a non-volatile memory array, a first read reference level of a plurality of read reference levels;

storing an indicator of the first read reference level in a non-volatile storage location associated with the first set of bit cells;

accessing the indicator of the first read reference level from the non-volatile storage location and storing the accessed indicator at a volatile storage location in response to a reset event;

accessing the indicator of the first read reference level from the volatile storage location in response to a read access operation to the first set of bit cells; and sensing a value stored at a memory location of the first set of bit cells based on the indicator of the first read reference level, the memory location of the first set of bit cells associated with the read access operation.

2. The method of claim 1, wherein sensing the value comprises:

generating the first read reference level based on the indicator; and comparing a reference output from the memory location with the first read reference level to determine the value.

3. The method of claim 1, wherein sensing the value stored at the memory location of the first set of bit cells comprises configuring a sense amplifier to sense the value using a read reference substantially equivalent to the first read reference level.

4. The method of claim 3, wherein configuring the sense amplifier to sense the value comprises configuring an adjustable read reference generator to provide the read reference substantially equivalent to the first read reference level to the sense amplifier.

5. The method of claim 1, wherein indicator from the non-volatile storage location with the indicator of the first read reference comprising a digital value representative of the first read reference level.

6. The method of claim 1, wherein determining the first read reference level comprises determining the first read reference level at a first time, the method further comprising:

determining, for the first set of bit cells, a second read reference level of a plurality of read reference levels at a second time subsequent to the first time; and storing an indicator of the second read reference level in the non-volatile storage location associated with the first set of bit cells.

7. The method of claim 6, further comprising:
accessing the indicator of the first read reference level in response to a first read access operation to the first set of bit cells occurring subsequent to the first time and prior to the second time;
sensing a value stored at a first memory location of the first set of bit cells based on the indicator of the first read reference level, the first memory location of the first set of bit cells associated with the first read access operation;
accessing the indicator of the second read reference level in response to a second read access operation to the first set of bit cells occurring subsequent to the second time; and
sensing a value stored at a second memory location of the first set of bit cells based on the indicator of the second read reference level, the second memory location of the first set of bit cells associated with the second read access operation.

8. The method of claim 1, further comprising:
determining, for a second set of bit cells of the non-volatile memory array, a second read reference level of the plurality of read reference levels; and
storing an indicator of the second read reference level in a non-volatile storage location associated with the second set of bit cells.

9. The method of claim 8, further comprising:
accessing the indicator of the first read reference level in response to a first read access operation to the first set of bit cells; and
sensing a value stored at a memory location of the first set of bit cells based on the indicator of the first read reference level, the memory location of the first set of bit cells associated with the first read access operation;
accessing the indicator of the second read reference level in response to a second read access operation to the second set of bit cells; and
sensing a value stored at a memory location of the second set of bit cells based on the indicator of the second read reference level, the memory location of the second set of bit cells associated with the second read access operation.

10. The method of claim 1, wherein determining the first read reference level comprises:
performing an erase operation on a subset of bit cells of the first set of bit cells;
determining each of the subset of bit cells has a select state based on a select read reference in response to performing the erase operation; and
determining the first read reference level based on the select read reference.

11. The method of claim 1, wherein determining the first read reference comprises:
performing a first erase operation on a subset of bit cells of the first set of bit cells;
determining at least one of the subset of bit cells has a first state based on a first read reference in response to performing the first erase operation;
adjusting the first read reference to generate a second read reference;
performing a second erase operation on the subset of bit cells subsequent to adjusting the first read reference;
determining each of the subset of bit cells has a second state based on the second read reference in response to performing the second erase operation;
determining the first read reference level based on the second read reference.

12. A device comprising:
a non-volatile memory array comprising a plurality of sets of bit cells;
a volatile storage location:
a plurality of non-volatile storage locations, each non-volatile storage location associated with a corresponding set of bit cells of the plurality of bit cells; and
a reference configuration module configured to:
determine a read reference level for each of the plurality of sets of bit cells and store an indicator of the read reference level in a corresponding non-volatile storage location of the plurality of non-volatile storage locations,
access the indicator of the read reference level from the non-volatile storage location and store the accessed indicator at the volatile storage location in response to a reset event: and
access the indicator of the first read reference level from the volatile storage location in response to a read access operation to the first set of bit cells; and
a sense amplifier module configured to sense a value stored at a memory location of the set of bit cells based on the indicator of the read reference level, the memory location of the set of bit cells associated with the read access operation.

13. The device of claim 12, further comprising:
an adjustable read reference module comprising an output to provide an adjustable read reference; and
a sense amplifier module comprising an output to provide a sensed value from a select set of bit cells of the non-volatile memory array based on the adjustable read reference; and
wherein the reference configuration module is configured to control the variable read reference module so as to adjust the adjustable read reference based on an indicator of a read reference level of the select set of bit cells in response to a read access request to a memory location of the select set of bit cells.

14. The device of claim 13, wherein the sense amplifier module comprises:
an input coupleable to the select set of bit cells; and
an input coupled to the output of the read reference module.

15. The device of claim 13, wherein the sense amplifier module comprises:
an input coupled to the output of the read reference module and coupleable to the select set of bit cells the output of the read reference module; and
an input to receive a fixed read reference.

16. The device of claim 12, wherein the bit cells of the non-volatile memory array comprise thin-film storage bit cells.

17. The device of claim 12, wherein the first set of bit cells comprises a sector of the non-volatile memory array.

18. A method comprising:
performing a first erase operation on a subset of bit cells of a set of bit cells of a non- volatile memory array;
determining at least one of the subset of bit cells has a first state based on a first read reference in response to performing the first erase operation;
adjusting the first read reference to generate a second read reference;
performing a second erase operation on the subset of bit cells subsequent to adjusting the first read reference;
determining each of the subset of bit cells has a second state based on the second read reference in response to performing the second erase operation;
determining a read reference level based on the second read reference; and storing an indicator of the read reference level in a non-volatile storage location associated with the set of bit cells.

19. The method of claim 18, further comprising:

accessing the indicator of the read reference level from the non-volatile storage location and storing the accessed indicator at a volatile storage location in response to a reset event.

20. The method of claim 19, further comprising:

accessing the indicator of the read reference level from the volatile storage location in response to a read access operation to the set of bit cells; and sensing a value stored at a memory location of the set of bit cells based on the indicator of the read reference level, the memory location of the set of bit cells associated with the read access operation.

21. The method of claim 20, wherein sensing the value comprises:

generating the read reference level based on the indicator accessed from the volatile storage location; and comparing a reference output from the memory location with the read reference level to determine the value.

* * * * *